United States Patent [19]
Kwan et al.

[11] Patent Number: 5,495,200
[45] Date of Patent: Feb. 27, 1996

[54] DOUBLE SAMPLED BIQUAD SWITCHED CAPACITOR FILTER

[75] Inventors: Tom W. Kwan, Reading; Paul F. Ferguson, Jr., Dracut; Wai L. Lee, Wilmington, all of Mass.

[73] Assignee: Analog Devices, Inc., Norwood, Mass.

[21] Appl. No.: 43,402

[22] Filed: Apr. 6, 1993

[51] Int. Cl.⁶ .................................................. H03B 1/00
[52] U.S. Cl. .............................................. 327/554; 327/561
[58] Field of Search ................................. 328/167, 149; 307/543, 556, 246, 494, 520, 522, 546; 330/258, 109, 107

[56] References Cited

U.S. PATENT DOCUMENTS

| | | | |
|---|---|---|---|
| 4,574,250 | 3/1986 | Senderowicz | 330/258 |
| 4,862,121 | 8/1989 | Hochschild et al. | 333/173 |
| 4,920,325 | 4/1990 | Nicollini et al. | 330/109 |

OTHER PUBLICATIONS

Friedman, et al, "A Bit–Slice Architecture for Sigma–Delta Analog–to–Digital Converters," IEEE Journal on Selected Areas in Commuications vol. 6, No. 3, Apr. 1988, pp. 520–526.

Shih, et al, "Reference Refreshing Cyclic Analog–to–Digital and Digital–to–Analog Converters," IEEE Journal of Solid–State Circuits, vol. SC–21, No. 4, Aug. 1986, pp. 544–554.

Ribner et al, "Biquad Alternatives for High–Frequency Switched Capacitor Filters", IEEE J. Solid–State Circuits, vol. SC–20, No. 6, Dec. 1985, pp. 1085–1095.

Senderowicz et al, "A Family of Differential NMOS Analog Circuits for PCM Codec Filter Chip", IEEE J. Solid–State Circuits, vol. SC–17, No. 6, Dec. 1982, pp. 1014–1023.

Sarhang–Nejad et al, "A True 16–Bit 20 KHz Multibit ΣΔ ADC With Digital Correction", IEEE 1992 Custom Integrated Circuits Conf., pp. 16.4.1–16.4.4.

*Primary Examiner*—William L. Sikes
*Assistant Examiner*—James A. Dudek
*Attorney, Agent, or Firm*—Wolf, Greenfield & Sacks

[57] ABSTRACT

A biquad switched capacitor filter is preferably utilized as the output filter in a sigma delta digital-to-analog converter. The switched capacitor filter uses a cross-coupled switched capacitor circuit which delivers charge to the capacitors on both phases of the clock. As a result, the sizes of the capacitors can be reduced by a factor of two, while delivering the same charge as a single sampling circuit. By using the cross-coupled switching circuit everywhere in the filter, the sensitivity to capacitor mismatches is substantially reduced. The clock phases applied to the stages of the filter are alternated so that there is a one clock cycle delay around each loop containing two filter stages, thereby insuring the stability of the filter.

11 Claims, 4 Drawing Sheets

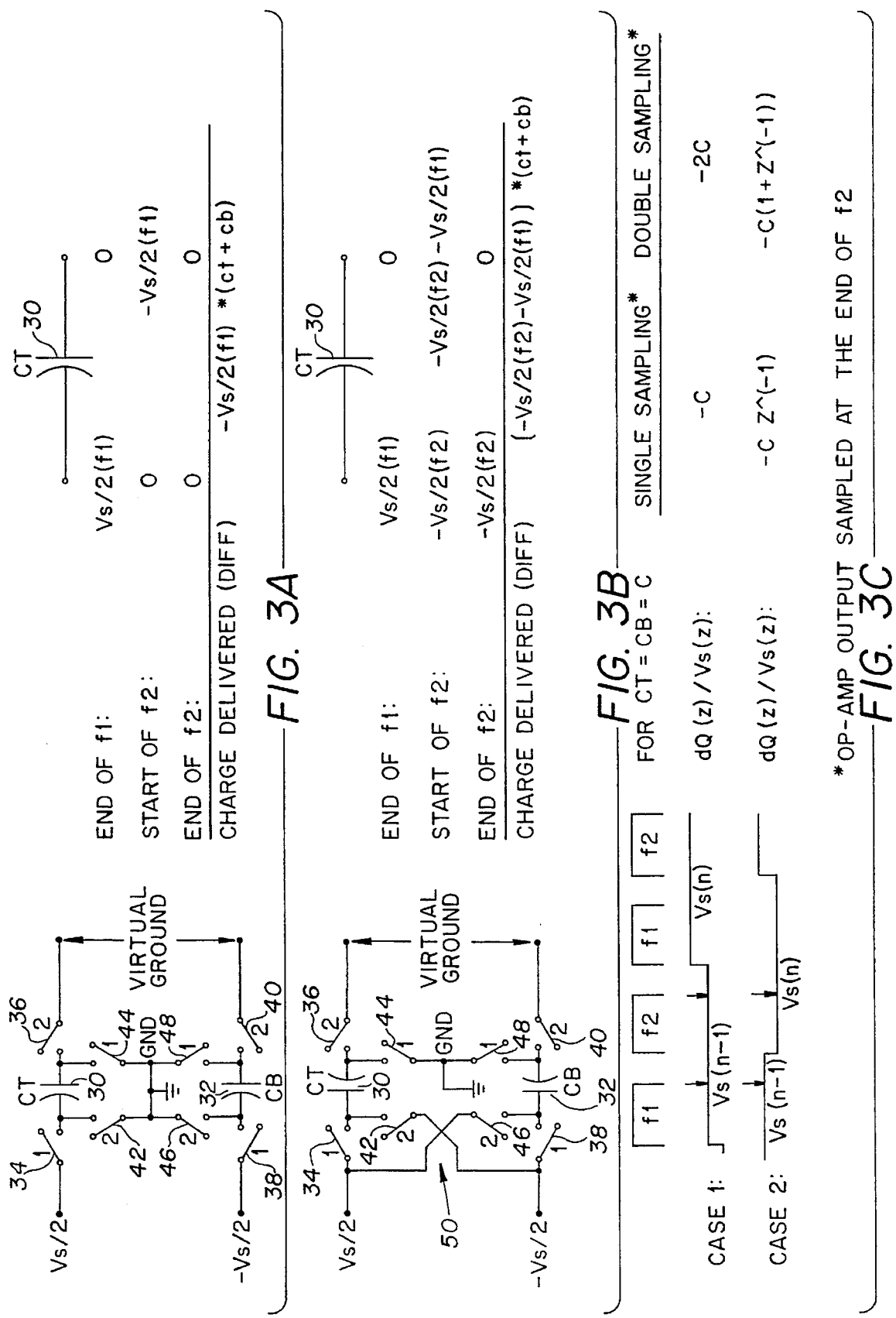

DOUBLE SAMPLED BIQUAD SWITCHED CAPACITOR FILTER

FIELD OF THE INVENTION

This invention relates to switched capacitor filters and, more particularly, to double sampled biquad switched capacitor filters. The switched capacitor filters of the present invention are particularly useful in sigma delta digital-to-analog converters, but are not Limited to such use.

BACKGROUND OF THE INVENTION

Sigma delta analog-to-digital converters (ADC's) and digital-to-analog converters (DAC's) have recently come into widespread use with the development of suitable process technology and the increase in digital audio and other applications. Sigma delta converters exhibit excellent linearity and low quantization noise. Because sigma delta ADC's utilize oversampling (sampling at rates in excess of the Nyquist rate), applications of sigma delta ADC's are typically limited to measurement, voice band and audio frequency ranges. Sigma delta ADC's and DAC's are particularly useful in mixed signal integrated circuits in which ADC, digital signal processing and DAC functions are monolithically integrated.

An important component of a sigma delta DAC is an analog output filter which receives an input from a one-bit digital-to-analog converter. The one-bit DAC output is averaged by the output filter to produce an analog output signal. The output filter removes shaped quantization noise in the upper frequency range and rejects images of the Nyquist sampling rate. The output filter typically includes several stages and must meet stringent requirements on amplitude and phase response, high frequency rejection and noise.

Switched capacitor output filters are frequently used for audio and voice band filtering because of their compatibility with integrated circuit processing. Typically, the basic elements of a switched capacitor filter are a capacitor and two switches. A charge is transferred from a voltage source to the capacitor through the first switch on a first clock phase. The first switch is opened, and the charge is transferred from the capacitor to an output through the second switch on a second clock phase. The switches are typically implemented as CMOS transistors. In audio filters, a large value resistor can be replaced with a switched capacitor, resulting in a reduction in area by a factor on the order of 100. An additional advantage of switched capacitor filters which use multiple capacitors is that the filter bandwidth is proportional to capacitance ratios rather than absolute values.

Switched capacitors are frequently used in active filters. In this case, switched capacitor circuits may be used in both the input and feedback paths of an operational amplifier. An exemplary switched capacitor integrator is disclosed by M. Sarhang-Nejad et al in "A True 16-Bit 20 kHz Multibit Sigma Delta ADC With Digital Correction", *IEEE 1992 Custom Integrated Circuits Conference Proceedings*, pages 16.4.1 to 16.4.4, but the literature contains numerous examples of switched capacitor filters. A switched capacitor filter configuration known as a biquad switched capacitor filter includes two integrator stages connected in series, with feedback from the output of the second stage to the input of the first stage. Biquad switched capacitor filters are disclosed by D. B. Ribner et al in "Biquad Alternatives for High Frequency Switched Capacitor Filters", *IEEE Journal of Solid State Circuits*, Vol. SC-20, No. 6, December 1985, pages 1085–1095 and by D. Senderowicz et al in "A Family of Differential NMOS Analog Circuits for a PCM Codec Filter Chip", *IEEE Journal of Solid State Circuits*, Vol. SC-17, No. 6, December 1982, pages 1014–1023.

All of the known prior art biquad switched capacitor filters have had one or more limitations, including relatively large chip area requirements, sensitivity to capacitor mismatches and relatively high noise outputs.

SUMMARY OF THE INVENTION

According to the present invention, a biquad switched capacitor filter comprises a first stage including a first operational amplifier having inverting and noninverting inputs for receiving an analog signal, and positive and negative outputs, and feedback capacitors connected between the outputs and opposite polarity inputs of the first operational amplifier, a second stage including a second operational amplifier having inverting and noninverting inputs and positive and negative outputs, and feedback capacitors connected between the outputs and opposite polarity inputs of the second operational amplifier, a first cross-coupled switched capacitor circuit for coupling charge from the outputs of the first operational amplifier to a first pair of capacitors on first and second clock phases and for coupling charge from the first pair of capacitors to the inputs of the second operational amplifier on the second clock phase, and a second cross-coupled switched capacitor circuit for coupling charge from the outputs of the second operational amplifier to a second pair of capacitors on the first and second clock phases and for coupling charge from the second pair of capacitors to the inputs of the first operational amplifier on the first clock phase.

A biquad switched capacitor filter preferably further includes a third stage including a third operational amplifier having inverting and noninverting inputs and positive and negative outputs, and feedback capacitors connected between the outputs and opposite polarity inputs of the third operational amplifier, a third cross-coupled switched capacitor circuit for coupling charge from the outputs of the second operational amplifier to a third pair of capacitors on the first and second clock phases and for coupling charge from the third pair of capacitors to inputs of the third operational amplifier on the first clock phase, and a fourth cross-coupled switched capacitor circuit for coupling charge from the outputs of the third operational amplifier to a fourth pair of capacitors on the first and second clock phases and for coupling charge from the fourth pair of capacitors to the inputs of the second operational amplifier on the second clock phase.

By using a configuration where charge is coupled to the capacitors in the switched capacitor circuits on both the first and second clock phases, the sizes of the capacitors in the circuit can be reduced by a factor of two as compared with circuits in which charge is coupled during only one clock phase, while delivering the same charge. By alternating the phases of the input supplied to the operational amplifier in each stage, a one clock cycle delay is provided in a loop comprising two stages, and stable operation is assured.

The biquad switched capacitor filter of the present invention is preferably utilized in a sigma delta digital-to-analog converter which includes an interpolation filter for increasing the data rate of an input data signal, a sigma delta modulator for converting the high rate data signal to a one-bit signal with shaped quantization noise and providing modulator output, a one-bit digital-to-analog converter for converting the modulator output to an analog signal, and an output filter for averaging the analog signal and removing high frequency components. The biquad switched capacitor filter is used as the output filter.

BRIEF DESCRIPTION OF THE DRAWINGS

For a better understanding of the present invention, together with other and further objects, advantages and capabilities thereof, reference is made to the accompanying drawings, which are incorporated herein by reference and in which:

FIG. 3A is a schematic diagram of a single sampling switched capacitor circuit;

FIG. 3B is a schematic diagram of a double sampling switched capacitor circuit;

FIG. 3C is a timing diagram which illustrates operation of the circuits shown in FIGS. 3A and 3B;

DETAILED DESCRIPTION OF THE INVENTION

Figure 1:
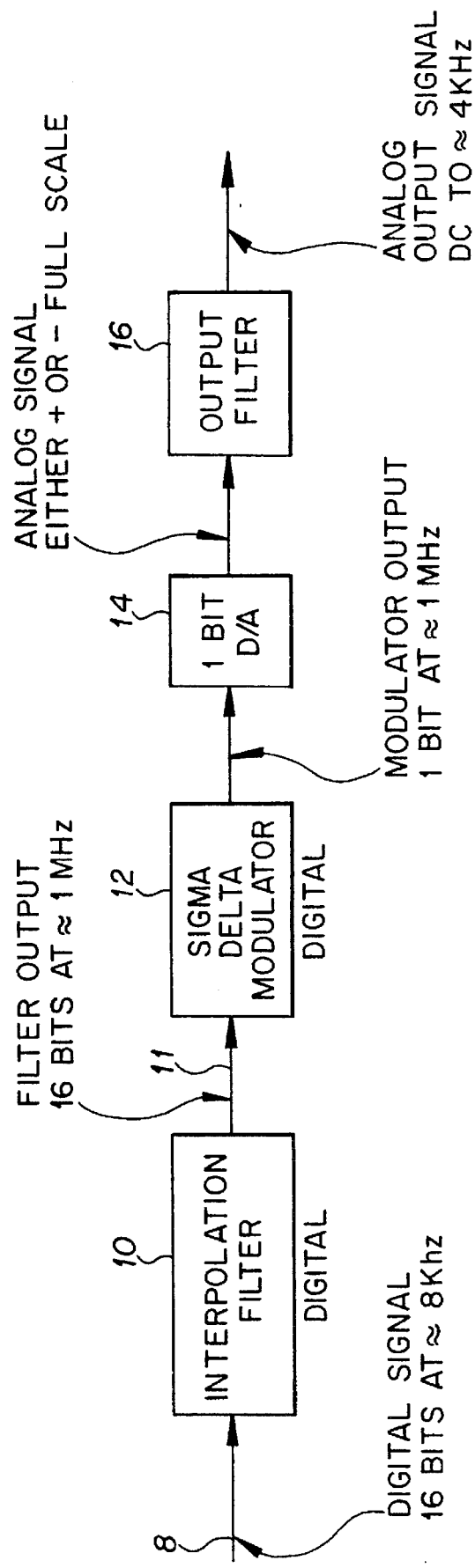
FIG. 1 is a block diagram of a sigma delta digital-to-analog converter.

A block diagram of a conventional sigma delta digital-to-analog converter (DAC) is shown in FIG. 1. Representative signals are indicated for an example of a 16-bit DAC which is updated at an 8 kHz rate to produce a voice band output signal having a bandwidth of 4 kHz. A 16-bit digital word on line 8 is fed through a digital interpolation filter 10 where the sampling rate is increased to 1.024 MHz, corresponding to an oversampling ratio of 128. The digital interpolation process can be viewed as the reconstruction of a higher rate digital signal from a lower rate digital signal. The input signal is expanded by inserting zero value samples between the data samples. The resulting signal is low pass filtered to produce a filtered output on line 11 whose sample rate is increased by a factor equal to the oversampling ratio.

A digital input sigma delta modulator 12 quantizes the 16-bit, 1.024 MHz data stream into a one-bit data stream with the quantization noise shaped to the high frequency range. The noise shaping transfer function is typically implemented in the digital domain with an infinite impulse response filter in a loop with a one-bit quantizer. The quantization noise is effectively high pass filtered. The output of the sigma delta modulator 12 is applied to a one-bit digital-to-analog converter 14. The output of the one-bit DAC 14 contains a large amount of quantization noise at high frequency, which is removed by an output filter 16. The filter output is an analog signal having a bandwidth of 4 kHz. The output filter 16 also removes the shaped quantization noise in the upper frequency range and rejects any images above the signal bandwidth. The output filter 16 must have filter characteristics that match the requirements of the overall system. For example, an audio system requires that the phase and amplitude response be preserved, while providing the appropriate rejection of high frequency components.

Figure 2:
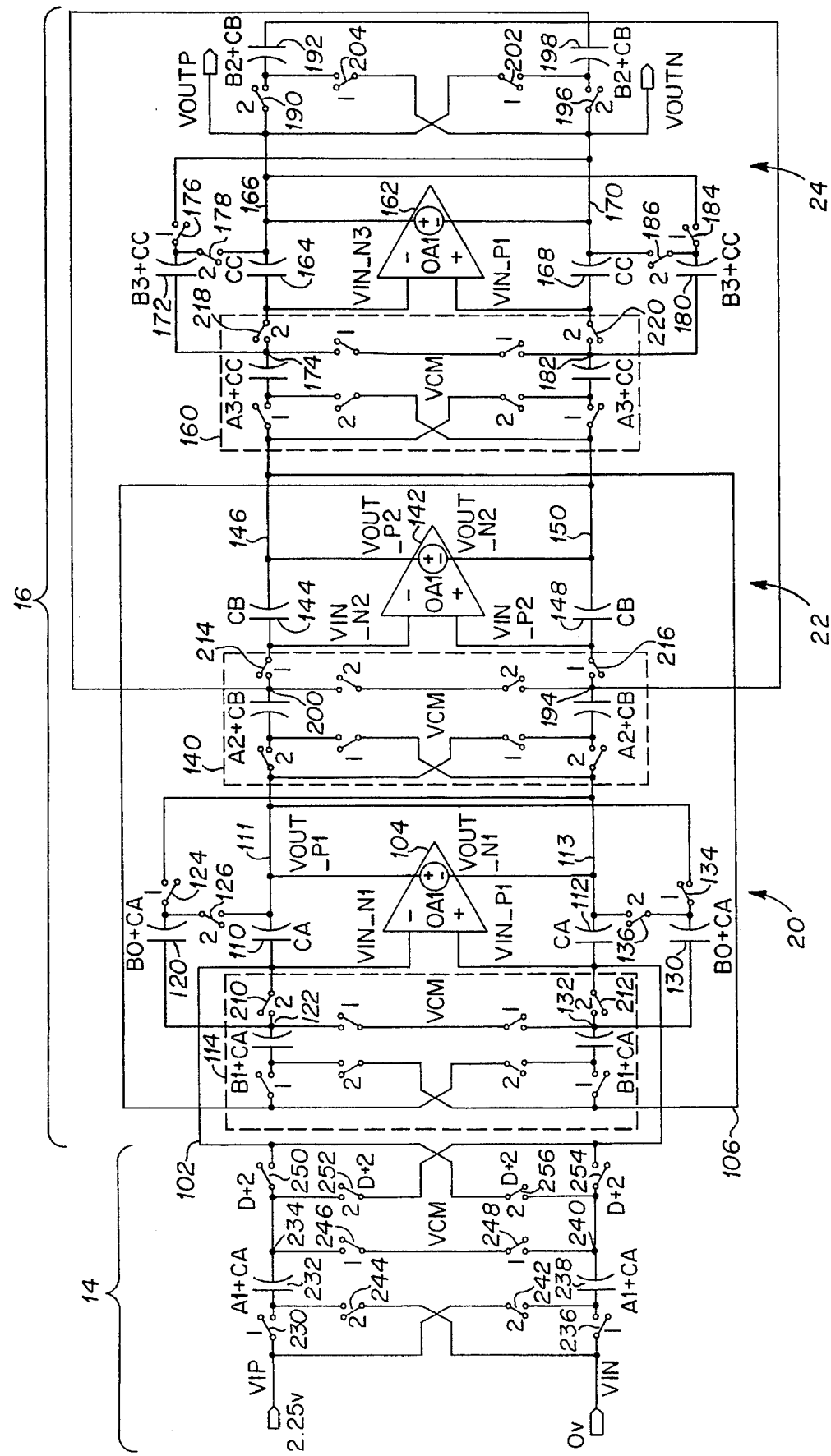
FIG. 2 is a schematic diagram of a one-bit digital-to-analog converter and a double sampling switched capacitor output filter in accordance with a preferred embodiment of the invention.

The present invention relates to a novel output filter 16. A schematic diagram of a preferred embodiment of the one-bit DAC 14 and the output filter 16 is shown in FIG. 2 in accordance with the invention. Filter 16 includes a first stage 20, a second stage 22 and a third stage 24 and uses a double sampling biquad switched capacitor filter structure as described in detail below. In the circuit diagram, each switch is represented by a conventional switch symbol with a numeral 1 or a numeral 2 to indicate the corresponding clock phase on which each switch is closed. Each clock cycle includes two nonoverlapping phases, phase 1 and phase 2. The switches are preferably implemented as CMOS transistors. Preferably, both plates of each capacitor are fabricated of polysilicon material.

The switched capacitor circuits used in the filter of FIG. 2 are described with reference to FIGS. 3A–3C. A single sampling switched capacitor circuit is shown in FIG. 3A. (This circuit is not used in the filter of FIG. 2, but is shown to facilitate an understanding of the double sampling circuit which is used.) Capacitors 30 and 32 deliver charge from a balanced input voltage source $V_s/2$, $-V_s/2$ to the inputs of an operational amplifier (not shown) which presents a virtual ground. Switches 34 and 36 are connected in series with capacitor 30, and switches 38 and 40 are connected in series with capacitor 32. Switches 42 and 44 are connected between opposite sides of capacitor 30 and ground, and switches 46 and 48 are connected between opposite sides of capacitor 32 and ground. The numeral 1 or 2 beside each switch indicates the clock phase which causes the switch to be closed. Charge is delivered from the input voltage source to capacitors 30 and 32 during clock phase 1, and charge is delivered from the capacitors 30 and 32 to the outputs (the inputs of an operational amplifier) during clock phase 2.

A double sampling switched capacitor circuit is shown in FIG. 3B. The switched capacitor circuit shown in FIG. 3B is similar to the circuit of FIG. 3A with an important exception. The switches 42 and 46 are not connected to ground Instead, switch 42 is connected between capacitor 30 and the negative voltage input $-V_s/2$. Switch 46 is connected between capacitor 32 and the positive voltage input $V_s/2$. The circuit shown in FIG. 3B with a cross-coupled input configuration samples the input twice per clock period, at the end of phase 1 and at the end of phase two. For the case of the input voltage changing during clock phase 1, the double sampling switched capacitor circuit shown in FIG. 3B has the feature of delivering twice the signal charge as the single sampling switched capacitor circuit shown in FIG. 3A for the same capacitance. Conversely, the same charge can be delivered with one half the capacitance by using the circuit of FIG. 3B.

The voltage on the capacitor 30 at various clock phases, and the charge delivered by capacitor 30 are shown in FIG. 3A for the single sampling switched capacitor circuit and are shown in FIG. 3B for the double sampling switched capacitor circuit. The operation of each circuit is illustrated in FIG. 3C.

Figure 4A:
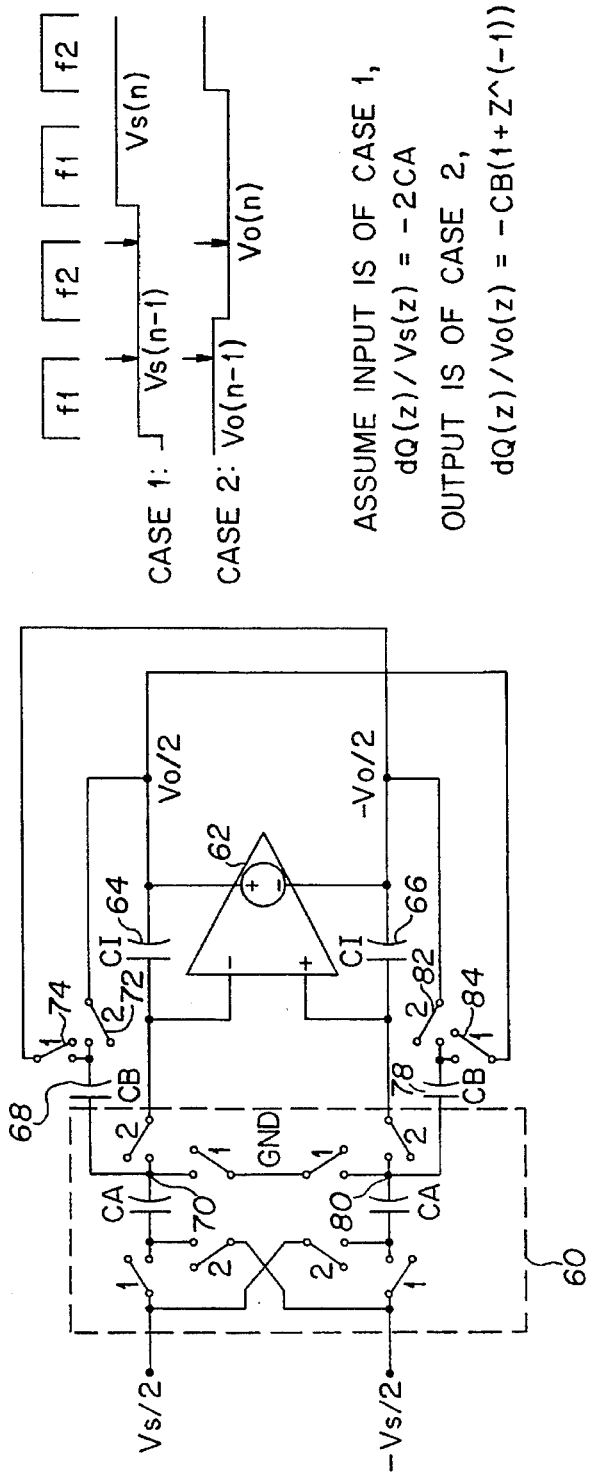
FIG. 4A is a schematic diagram of a double sampling switched capacitor integrator.

A double sampling switched capacitor integrator is shown in FIG. 4A. A double sampling switched capacitor circuit 60 receives inputs from a voltage source $V_s/2$, $-V_s/2$ and provides a positive output to an inverting input of an operational amplifier 62 and a negative output to a noninverting input of operational amplifier 62. The switched capacitor circuit 60 has the cross-coupled configuration of the double sampling switched capacitor circuit 50 shown in FIG. 3B and described above. A feedback capacitor 64 is connected between a positive output and the inverting input of operational amplifier 62, and a feedback capacitor 66 is connected between a negative output and the noninverting input of operational amplifier 62. A feedback capacitor 68 has one lead connected to a node 70 of the cross-coupled switched capacitor circuit 60. The other lead of capacitor 68 is connected through a switch 72 to the positive output of operational amplifier 62 and through a switch 74 to the negative output of operational amplifier 62. A feedback capacitor 78 has one lead connected to a node 80 of cross-coupled switched capacitor circuit 60. The other lead of capacitor 78 is connected through a switch 82 to the negative output of operational amplifier 62 and through a switch 84 to the positive output of operational amplifier 62.

Figure 4B:
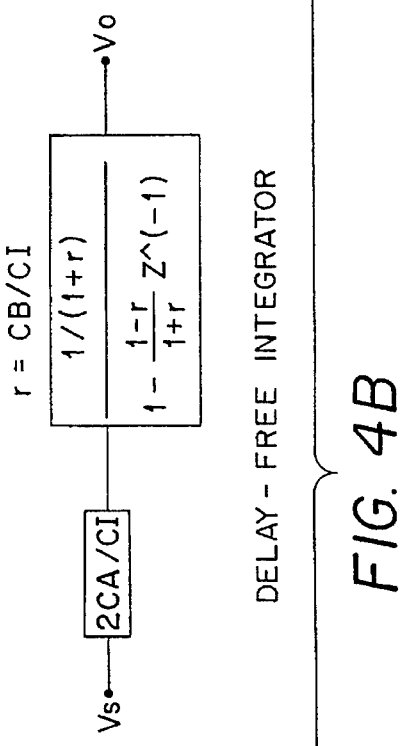
FIG. 4B shows a Z domain equivalent of the double sampling switched capacitor integrator of FIG. 4A.

Operation of the double sampling switched capacitor integrator is shown in FIG. 4A. The Z-domain equivalent of the switched capacitor integrator is shown in FIG. 4B. The transfer function is delay-free. A two integrator loop using switched capacitor integrators as shown would be unstable because it would contain a delay-free loop. However, if the clock phases of the two integrators alternate, then a delay of one sample is obtained around the loop. The requirement for alternating clock phases implies that only even order internal integrator loops can be realized. Thus, each integrator alternates in the charge dumping phase relative to the integrator preceding it.

Referring again to FIG. 2, a positive output 102 of one-bit DAC 14 is connected to the inverting input of an operational amplifier 104 in first stage 20, and the negative output 106 of one-bit DAC 14 is connected to the noninverting input of operational amplifier 104. A feedback capacitor 110 is connected between a positive output 111 and the inverting input of operational amplifier 104, and a feedback capacitor 112 is connected between a negative output 113 and the noninverting input of operational amplifier 104.

As used herein, the terms "positive output" and "negative output" are relative terms. When the circuit is operated from positive and negative supplies, the outputs may, in fact, be positive and negative relative to ground. However, the circuit may be operated from a single voltage supply. In this case, both outputs may be positive or negative, with the positive output being positive relative to the negative output.

A cross-coupled switched capacitor circuit 114 has its outputs connected to the inverting and noninverting inputs of operational amplifier 104. The switched capacitor circuit 114 has the same configuration as the switched capacitor circuit 50 shown in FIG. 3B and described above. A feedback capacitor 120 has one lead connected to a node 122 of cross-coupled switched capacitor circuit 114. The other lead of feedback capacitor 120 is connected through a switch 124 to the negative output 113 of operational amplifier 104 and through a switch 126 to the positive output 111 of operational amplifier 104. A feedback capacitor 130 has one lead connected to a node 132 of cross-coupled switched capacitor circuit 114. The other lead of feedback capacitor 130 is connected through a switch 134 to the positive output 111 of operational amplifier 104 and through a switch 136 to the negative output 113 of operational amplifier 104.

The positive output 111 and the negative output 113 of operational amplifier 104 are connected through a cross-coupled switched capacitor circuit 140 to the inverting and noninverting inputs, respectively, of an operational amplifier 142 in second stage 22. The cross-coupled switched capacitor circuit 140 has the same configuration as the switched capacitor circuit 50 shown in FIG. 3B and described above. A feedback capacitor 144 is connected between a positive output 146 and the inverting input of operational amplifier 142, and a feedback capacitor 148 is connected between a negative output 150 and the noninverting input of operational amplifier 142.

The positive output 146 of operational amplifier 142 is connected to the negative input of switched capacitor circuit 114, and the negative output 150 of operational amplifier 142 is connected to the positive input of switched capacitor circuit 114. The connections between the outputs of operational amplifier 142 and the inputs of switched capacitor circuit 114 form a closed loop around first stage 20 and second stage 22. The closed loop configuration of first stage 20 and second stage 22 constitutes a biquad switched capacitor filter.

The positive output 146 and the negative output 150 of operational amplifier 142 are connected through a cross-coupled switched capacitor circuit 160 to the inverting and noninverting inputs, respectively, of an operational amplifier 162 in third stage 24. A feedback capacitor 164 is connected between a positive output 166 and the inverting input of operational amplifier 162, and a feedback capacitor 168 is connected between a negative output 170 and the noninverting input of operational amplifier 162. A feedback capacitor 172 has a first lead connected to a node 174 of switched capacitor circuit 160. The other lead of feedback capacitor 172 is connected through a switch 176 to the negative output 170 of operational amplifier 162 and through a switch 178 to the positive output 166 of operational amplifier 162. A feedback capacitor 180 has one lead connected to a node 182 of switched capacitor circuit 160. The other lead of feedback capacitor 180 is connected through a switch 184 to the positive output 166 of operational amplifier 162 and through a switch 186 to the negative output 170 of operational amplifier 162.

The positive output 166 and the negative output 170 constitute the positive and negative outputs, respectively, of the biquad switched capacitor filter. The positive output 166 is connected through a switch 190 and a capacitor 192 to a node 194 in switched capacitor circuit 140 of second stage 22. The negative output 170 is connected through a switch 196 and a capacitor 198 to a node 200 in switched capacitor circuit 140 of second stage 22. The positive output 166 is cross-coupled through a switch 202 to capacitor 198, and negative output 170 is cross-coupled through a switch 204 to capacitor 192. The connections from the outputs of third stage 24 to the inputs of second stage 22 form a closed loop around second stage 22 and third stage 24. The second stage 22 and the third stage 24 constitute a biquad switched capacitor filter. The structure shown in FIG. 2 is known generally as a "ladder" or "leapfrog" filter structure. The filter may have more than three stages. Typically the feedback capacitors 120, 130, 172, 180 are used only on the first and last stages. In one example, the filter shown in FIG. 2 is a third order Chebychev filter having 0.1 dB passband ripple and a bandwidth of 25 kHz. The sampling rate is 3072 kHz.

The biquad switched capacitor filter structure shown in FIG. 2 and described above has important features which provide superior performance. Cross-coupling of signals is used everywhere in the filter, including the switched capacitor circuits 114, 140 and 160, and the switched capacitor circuit including capacitors 192, 198 and switches 190, 196, 202 and 204. In addition, cross-coupling of signals is used in the feedback paths around each pair of stages, with feedback capacitors 120 and 130 in first stage 20, and with feedback capacitors 172 and 180 in third stage 24. The use of cross-coupling everywhere in the circuit produces several advantages in circuit operation. The cross-coupled configuration produces a transfer function having additional terms as compared with a filter not using cross-coupling or using cross-coupling only at the integrator inputs. The additional terms significantly reduce the sensitivity of the transfer function to capacitor mismatches, which tend to occur with the small values of capacitance used in the filter circuit. Furthermore, the disclosed filter structure permits a reduction in capacitor size by a factor of four with the same signal-to-noise ratio. The reduction in capacitor size also permits a reduction of the power and the areas of the operational amplifiers in the circuit, since the load placed on the operational amplifiers is reduced by a factor of four.

In addition, the use of cross-coupling everywhere in the filter tends to reduce transients in the outputs of the operational amplifiers. The signal at the output of each operational amplifier is the integral of the sum of charges delivered to it on each clock phase. When some paths deliver charges on both clock phases, and other paths deliver charge on only one clock phase, as occurs when cross-coupling is not used everywhere in the circuit, then the cancellation of charges that tends to keep operational amplifier transients small does not occur. In this case, the design must account for large output excursions, and the dynamic range is reduced.

A further feature of the biquad switched capacitor filter shown in FIG. 2 is that the clock phases of the stages alternate. Thus, switches 210 and 212 in switched capacitor circuit 114 of first stage 20 deliver charge to the inputs of operational amplifier 104 on clock phase 2. Capacitors 214 and 216 in switched capacitor circuit 140 of second stage 22 deliver charge to the inputs of operational amplifier 142 on clock phase 1. Capacitors 218 and 220 in switched capacitor circuit 160 of third stage 24 deliver charge to the inputs of operational amplifier 162 on clock phase 2. Because of the alternating clock phases, there is a one clock cycle delay in the feedback loop of each biquad switched capacitor filter, and stable operation is assured.

The one-bit DAC 14 uses a switched capacitor structure. A positive side of a reference voltage is connected through a switch 230 to a first lead of a capacitor 232. A second lead of capacitor 232 is connected to a node 234. The negative side of the reference voltage is connected through a switch 236 to a first lead of a capacitor 238. The second lead of capacitor 238 is connected to a node 240. The positive side of the reference voltage is also connected through a switch 242 to the first lead of capacitor 238, and the negative side of the reference voltage is connected through a switch 244 to the first lead of capacitor 232, thus providing a cross-coupled input configuration. The node 234 is connected through a switch 246 to a circuit ground, and the node 240 is connected through a switch 248 to the circuit ground. The node 234 is connected through a switch 250 to the inverting input of operational amplifier 104 and through a switch 252 to the noninverting input of operational amplifier 104. Node 240 is connected through a switch 254 to the noninverting input of operational amplifier 104 and through a switch 256 to the inverting input of operational amplifier 104. The switches, 250, 252, 254 and 256 form a cross-coupled configuration to the input of first stage 20. The switches 250, 252, 254 and 256 are controlled by signals which are different from the phase 1 and phase 2 clock signals that control the other switches in the circuit. In particular, switches 250 and 254 are controlled by a signal which is formed by logically ANDing the data output of sigma delta modulator 12 (FIG. 1) with clock phase 2. Similarly, switches 252 and 256 are controlled by a signal which is formed by logically ANDing the inverted data output of sigma delta modulator 12 with clock phase 2. Thus, the delivery of charge from capacitors 232 and 238 to the output filter 16 is controlled by data dependent switching. The cross-coupled configuration of one-bit DAC 14 permits a reduction of capacitor values in the same manner described above in connection with the biquad switched capacitor filter.

While there have been shown and described what are at present considered the preferred embodiments of the present invention, which have been disclosed by way of example only, it will be obvious to those skilled in the art that various changes and modifications may be made therein without departing from the spirit and scope of the invention as presented above and as defined by the appended claims and equivalents thereto.

What is claimed is:

1. A biquad switched capacitor filter comprising:
   a first stage including a first operational amplifier having inverting and noninverting inputs for receiving an analog signal, and positive and negative outputs, and feedback capacitors connected between said outputs and opposite polarity inputs of said first operational amplifier;
   a second stage including a second operational amplifier having inverting and noninverting inputs and positive and negative outputs, and feedback capacitors connected between said outputs and opposite polarity inputs of said second operational amplifier;
   a first cross-coupled switched capacitor circuit for coupling charge from the outputs of said first operational amplifier to a first pair of capacitors on first and second clock phases and for coupling charge from said first pair of capacitors to the inputs of said second operational amplifier on said second clock phase; and
   a second cross-coupled switched capacitor circuit for coupling charge from the outputs of said second operational amplifier to a second pair of capacitors on said first and second clock phases and for coupling charge from said second pair of capacitors to the inputs of said first operational amplifier on said first clock phase.

2. A biquad switched capacitor filter as defined in claim 1 further including
   a third stage including a third operational amplifier having inverting and noninverting inputs and positive and negative outputs, and feedback capacitors connected between said outputs and opposite polarity inputs of said third operational amplifier;
   a third cross-coupled switched capacitor circuit for coupling charge from the outputs of said second operational amplifier to a third pair of capacitors on said first and second clock phases and for coupling charge from said third pair of capacitors to the inputs of said third operational amplifier on said first clock phase; and
   a fourth cross-coupled switched capacitor circuit for coupling charge from the outputs of said third operational amplifier to a fourth pair of capacitors on said first and second clock phases and for coupling charge from said fourth pair of capacitors to the inputs of said second operational amplifier on said second clock phase.

3. A biquad switched capacitor filter as defined in claim 1 wherein each of said cross-coupled switched capacitor circuits includes means for coupling an input voltage to said pair of capacitors during one clock phase and means for coupling said input voltage with reversed polarity to said pair of capacitors during the other clock phase.

4. A biquad switched capacitor filter as defined in claim 1 wherein each of said cross-coupled switched capacitor circuits is implemented with CMOS transistors.

5. A biquad switched capacitor filter as defined in claim 1 wherein each of said cross-coupled switched capacitor circuits includes a first switch connected between a positive input and a first capacitor of said pair of capacitors, a second switch connected between a negative input and a second capacitor of said pair of capacitors, a third switch connected between said positive input and said second capacitor, and a fourth switch connected between said negative input and said first capacitor, said first and second switches being closed in response to one of said clock phases and said third and fourth switches being closed in response to the other of said clock phases.

6. In combination:

A one-bit digital-to-analog converter for converting a data stream to an analog signal; and a biquad switched capacitor filter comprising:
- a first stage including a first operational amplifier having inverting and noninverting inputs for receiving said analog signal, and positive and negative outputs, and feedback capacitors connected between said outputs and opposite polarity inputs of said first operational amplifier;
- a second stage including a second operational amplifier having inverting and noninverting inputs and positive and negative outputs, and feedback capacitors connected between said outputs and opposite polarity inputs of said second operational amplifier;
- a first cross-coupled switched capacitor circuit for coupling charge from the outputs of said first operational amplifier to a first pair of capacitors on first and second clock phases and for coupling charge from said first pair of capacitors to the inputs of said second operational amplifier on said second clock phase; and
- a second cross-coupled switched capacitor circuit for coupling charge from the outputs of said second operational amplifier to a second pair of capacitors on said first and second clock phases and for coupling charge from said second pair of capacitors to the inputs of said first operational amplifier on said first clock phase.

7. The combination as defined in claim 6 wherein said one-bit digital-to-analog converter comprises a cross-coupled switched capacitor circuit including a pair of capacitors, switching means for coupling charge from a reference source to said pair of capacitors during said first and second clock phases and switching means for coupling charge from said pair of capacitors to said biquad switched capacitor filter during said second clock phase using data dependent switch control signals.

8. The combination as defined in claim 6 wherein said biquad switched capacitor filter further includes:
- a third stage including a third operational amplifier having inverting and noninverting inputs and positive and negative outputs, and feedback capacitors connected between said outputs and opposite polarity inputs of said third operational amplifier;
- a third cross-coupled switched capacitor circuit for coupling charge from the outputs of said second operational amplifier to a third pair of capacitors on said first and second clock phases and for coupling charge from said third pair of capacitors to the inputs of said third operational amplifier on said first clock phase; and
- a fourth cross-coupled switched capacitor circuit for coupling charge from the outputs of said third operational amplifier to a fourth pair of capacitors on said first and second clock phases and for coupling charge from said fourth pair of capacitors to the inputs of said second operational amplifier on said second clock phase.

9. The combination as defined in claim 6 wherein each of said cross-coupled switched capacitor circuits includes means for coupling an input voltage to said pair of capacitors during one clock phase and means for coupling said input voltage with reversed polarity to said pair of capacitors during the other clock phase.

10. The combination as defined in claim 6 wherein each of said cross-coupled switched capacitor circuits is implemented with CMOS transistors.

11. A sigma delta digital-to-analog converter comprising:

an interpolation filter for increasing the rate of an input digital signal to provide a high data rate digital signal;

a sigma delta modulator for converting the high data rate digital signal to a one-bit signal with shaped quantization noise and providing a modulator output;

a one-bit digital-to-analog converter for converting the modulator output to an analog signal; and a biquad switched capacitor output filter comprising:
- a first stage including a first operational amplifier having inverting and noninverting inputs for receiving said analog signal, and positive and negative outputs, and feedback capacitors connected between said outputs and opposite polarity inputs of said first operational amplifier;
- a second stage including a second operational amplifier having inverting and noninverting inputs and positive and negative outputs, and feedback capacitors connected between said outputs and opposite polarity inputs of said second operational amplifier;
- a first cross-coupled switched capacitor circuit for coupling charge from the outputs of said first operational amplifier to a first pair of capacitors on first and second clock phases and for coupling charge from said first pair of capacitors to the inputs of said second operational amplifier on said second clock phase; and
- a second cross-coupled switched capacitor circuit for coupling charge from the outputs of said second operational amplifier to a second pair of capacitors on said first and second clock phases and for coupling charge from said second pair of capacitors to the inputs of said first operational amplifier on said first clock phase.

* * * * *